US012723306B2

(12) United States Patent
Xu et al.

(10) Patent No.: US 12,723,306 B2
(45) Date of Patent: Sep. 1, 2026

(54) ACOUSTIC WAVE ASSISTED CHEMICAL VAPOR IINFILTRATION

(71) Applicant: RTX Corporation, Farmington, CT (US)

(72) Inventors: JinQuan Xu, East Greenwich, RI (US); Ying She, Rocky Hill, CT (US)

(73) Assignee: RTX Corporation, Farmington, CT (US)

( * ) Notice: Subject to any disclaimer, the term of this patent is extended or adjusted under 35 U.S.C. 154(b) by 479 days.

(21) Appl. No.: 18/232,983

(22) Filed: Aug. 11, 2023

(65) Prior Publication Data

US 2024/0141479 A1 May 2, 2024

Related U.S. Application Data

(60) Provisional application No. 63/420,979, filed on Oct. 31, 2022.

(51) Int. Cl.

*C23C 16/04* (2006.01)
*C23C 16/455* (2006.01)
*C23C 16/458* (2006.01)

(52) U.S. Cl.

CPC ...... *C23C 16/045* (2013.01); *C23C 16/45578* (2013.01); *C23C 16/4587* (2013.01)

(58) Field of Classification Search

CPC . C04B 35/80; C04B 35/565; C04B 35/62863; C04B 2235/614; C23C 16/4415; C23C 16/045

See application file for complete search history.

(56) References Cited

U.S. PATENT DOCUMENTS 5,254,374 A * 10/1993 Devlin .................... C04B 35/64 427/398.1
5,569,502 A 10/1996 Koinuma et al.
6,391,396 B1 5/2002 Barmatz et al.
6,784,083 B1 8/2004 Gealy et al.
10,837,109 B2 11/2020 She et al.
10,934,219 B2 3/2021 Jackson
2010/0304146 A1* 12/2010 Krebs ................ C23C 16/4415 134/1.1
2019/0092698 A1* 3/2019 Kirkpatrick ........... F16D 69/023
2021/0261469 A1 8/2021 She et al.

FOREIGN PATENT DOCUMENTS

KR 100571606 B1 4/2006

OTHER PUBLICATIONS

Extended European Search Report for EP Application No. 23205032.8, dated Apr. 12, 2024, 7 pages.

* cited by examiner

*Primary Examiner* — Joseph A Miller, Jr.
(74) *Attorney, Agent, or Firm* — Kinney & Lange, P.A.

(57) ABSTRACT

A chemical vapor infiltration (CVI) system comprises a reactor with an inlet for receiving a flow of reactive gas and an outlet for exhausting the flow of reactive gas, and plurality of acoustic wave generators disposed to generate acoustic waves within the reactor.

19 Claims, 5 Drawing Sheets

ACOUSTIC WAVE ASSISTED CHEMICAL VAPOR IINFILTRATION

CROSS-REFERENCE TO RELATED APPLICATION(S)

This application claims the benefit of U.S. Provisional Application No. 63/420,979 filed Oct. 31, 2022 for "ACOUSTIC WAVE ASSISTED CHEMICAL VAPOR INFILTRATION" by J. Xu and Y. She.

BACKGROUND

The present invention relates to chemical vapor infiltration (CVI), and more particularly to means for improving CVI.

CVI processes can be used to fills in the voids of a porous preform and form the matrix to create a composite. These processes rely primarily on diffusion of vaporous precursors around the porous preform to deposit the matrix material. Conventional CVI can, however, be inefficient, as it is considerably slow to infiltrate a porous preform to an appreciable matrix volume. Thus, a means of increasing CVI efficiency without compromising composite quality is desirable.

SUMMARY

A chemical vapor infiltration (CVI) system comprises a reactor with an inlet for receiving a flow of reactive gas and an outlet for exhausting the flow of reactive gas, and plurality of acoustic wave generators disposed to generate acoustic waves within the reactor.

A method of performing CVI comprises placing a fibrous preform within a reactor, flowing a reactive gas through an inlet of the reactor, and generating acoustic waves at a first frequency within the reactor.

Figure 1:
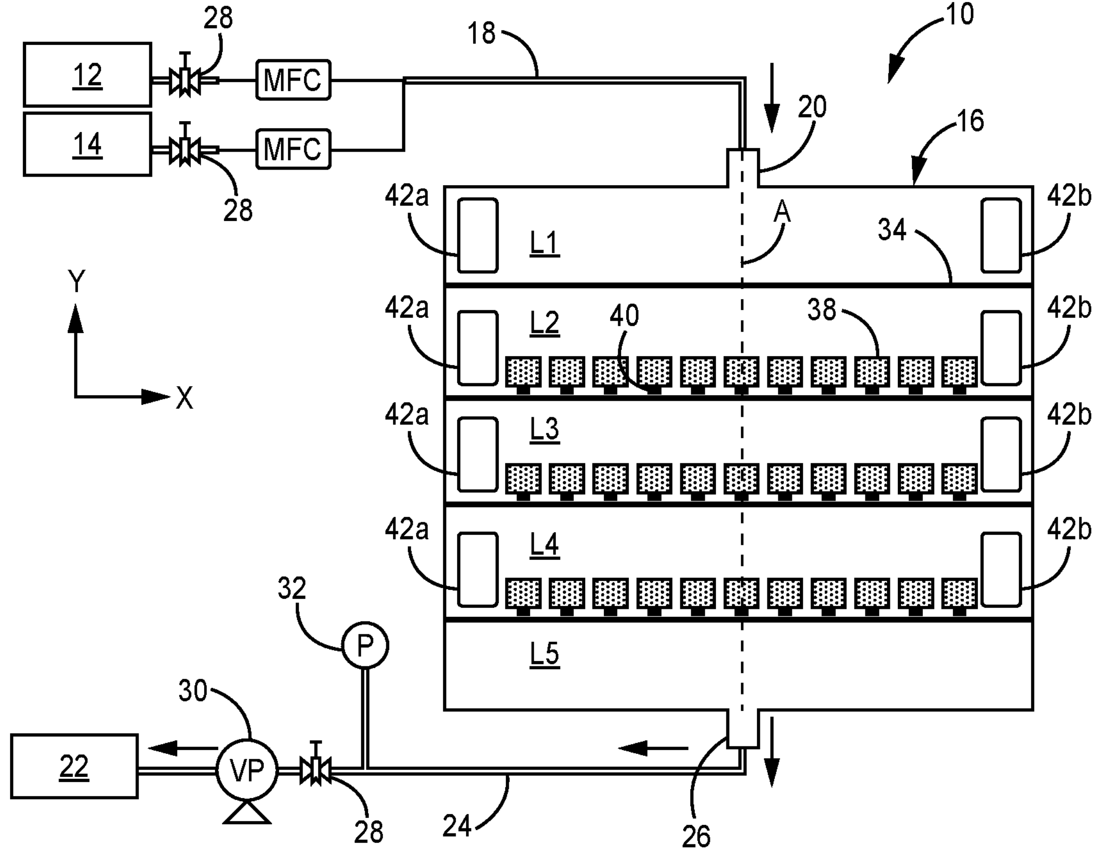
FIG. 1 is a schematic illustration of a CVI system according to a first embodiment.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

This disclosure presents means for enhancing CVI using acoustic waves. More specifically, acoustic wave generators can be variously positioned within a CVI reactor to influence the disbursement of reactive CVI gas through the reactor such that enclosed preforms are more evenly and efficiently infiltrated.

FIG. 1 is a schematic illustration of CVI system 10. CVI system 10 includes sources 12 and 14 of a reactive precursor and process/carrier gas, respectively, in flow communication with reactor (or furnace) 16 via line 18 at reactor inlet 20. The reactive precursor and process gas can be combined at line 18 into a reactive gas. Reactor 16 is in flow communication with exhaust outlet 22 via line 24 at reactor outlet 26. Longitudinal axis A (aligned with the y-axis) of reactor 16 is disposed between inlet 20 and outlet 26. Various valves 28 can be used to control the flow from any of sources 12 and 14, and/or to exhaust outlet 22. Vacuum pump 30 can be used to change the pressure within reactor 16 by, for example, removing reactive gas from within reactor 16 to lower pressure, and pressure transducer 32 can sense vapor pressure within reactor 16. In an alternative embodiment, the location of inlet 20, outlet 26, and associated upstream/downstream components can be reversed.

Reactor 16 can include multiple levels L1-L5, defined by a plurality of perforated support plates 34, stacked vertically (i.e., in the y-direction). Each perforated plate 34 can include holes 36 (shown and labeled in FIG. 2) allowing the reactive gas (i.e., the mixture of precursor and process gas) to flow through to each level. As shown in FIG. 1, several plates 34 support multiple fibrous preforms 38. In an exemplary embodiment, preforms 38 can be formed from tows of silicon carbide (SiC) fibers arranged in one of various two or three-dimensional woven architectures such as plain, harness (e.g., 3, 5, 8, etc.), twill, braid, or non-symmetric to name a few non-limiting examples. In an alternative embodiment, preforms 38 can be formed from non-woven (e.g., chopped, felted, etc.) fibers. Levels L2, L3, and L4 containing preforms 38 can be associated with a working/deposition zone of reactor 16. Level L1, the uppermost level proximate inlet 20 can be associated with a premixing/preheating zone of reactor 16, and therefore does not include preforms 38. An alternative embodiment can include fewer plates 34 defining fewer levels (e.g., four, three, or two levels), or additional plates 34 defining more levels (e.g., six levels, seven levels, or eight levels). Spacers 40 can be used to space preforms 38 apart from a respective plate 34.

Reactor 16 also includes acoustic wave generators 42 (e.g., speakers) for generating acoustic waves within reactor 16 during the CVI process. In the embodiment shown in FIG. 1, each level L1-L4 includes a pair of oppositely disposed (i.e., in the x-direction) acoustic wave generators 42. Each acoustic wave generator 42*a*, 42*b* of a respective pair is oriented to generate acoustic waves in the direction of the oppositely disposed acoustic wave generator. That is, acoustic waves can generally travel in the x-direction. In an alternative embodiment, reactor 16 can include a single pair of acoustic wave generators 42*a*, 42*b*, with sized to extend through multiple levels.

Figure 2:
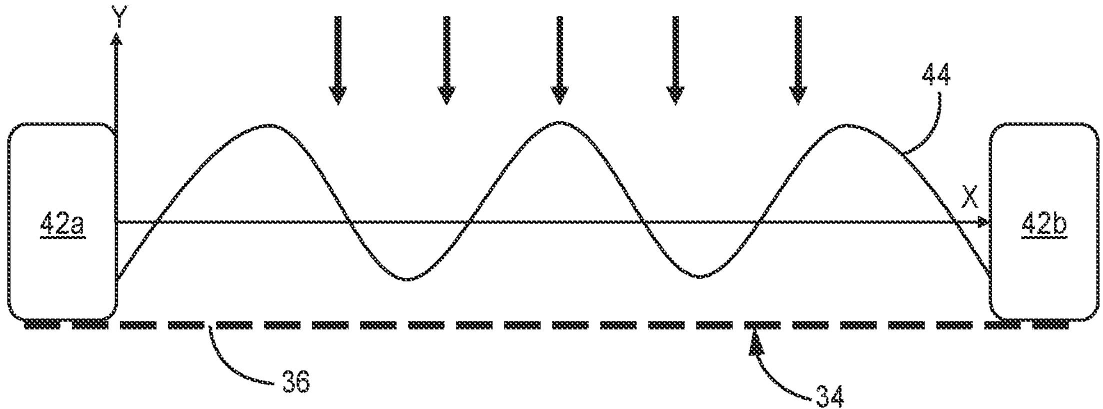
FIG. 2 is a schematic illustration showing acoustic wave generation at one level of the CVI system of FIG. 1

FIG. 2 is a schematic illustration of a single level from reactor 16 with plate 34 and oppositely disposed acoustic wave generators 42*a*, 42*b*. For simplicity, preforms 38 are omitted. In operation of acoustic wave generators 42*a*, 42*b*, sound wave 44, represented as a single sinusoidal wave, can travel in either direction along the x-axis, depending on which acoustic wave generator 42*a* or 42*b* is the source of wave 44. Both acoustic wave generators 42*a*, 42*b* can be operated such that multiple sounds waves 44 can travel in opposite directions along the x-axis (i.e., travelling waves). Such mode of operation can include operating each acoustic wave generator 42*a*, 42*b* simultaneously and at a different frequency and/or amplitude, or by alternatingly generating wave 44 (i.e., pulsing) at each acoustic wave generator 42*a*, 42*b*. In an alternative embodiment, standing waves can additionally and/or alternatively form as waves are reflected back and forth at a resonance frequency of reactor 16. The frequency of sounds waves 44 can, for example, be selected to be high enough to generate multiple phases between a respective pair of acoustic wave generators 42*a*, 42*b*. In one embodiment, such a frequency can range from 1 Hz to 100 kHz, from 1 kHz to 50 kHz, or from 5 kHz to 10 kHz. Further, at earlier stages of the CVI process with pores within preforms 38 are larger, a lower frequency and higher amplitude can be generated, whereas at later stages of CVI, as pore size is reduced, a higher frequency and lower amplitude can be generated.

Referring to FIGS. 1 and 2, during the CVI process, reactive gases enter reactor 16 at inlet 20, and travel primarily in the y-direction toward outlet 26, infiltrating preforms 38 and passing through holes 36 in plates 34. This flow, represented by downward-facing arrows in FIG. 2, can be better distributed in the x-direction at a given level by wave(s) 44 to facilitate more uniform infiltration across preforms 38 on a given plate 34. Operation of acoustic wave generators 42 at level L1, (i.e., the premixing/preheating zone), can help facilitate the mixing of precursors and carrier gas by further disturbing precursor and gas molecules as they enter reactor 16.

Figure 3:
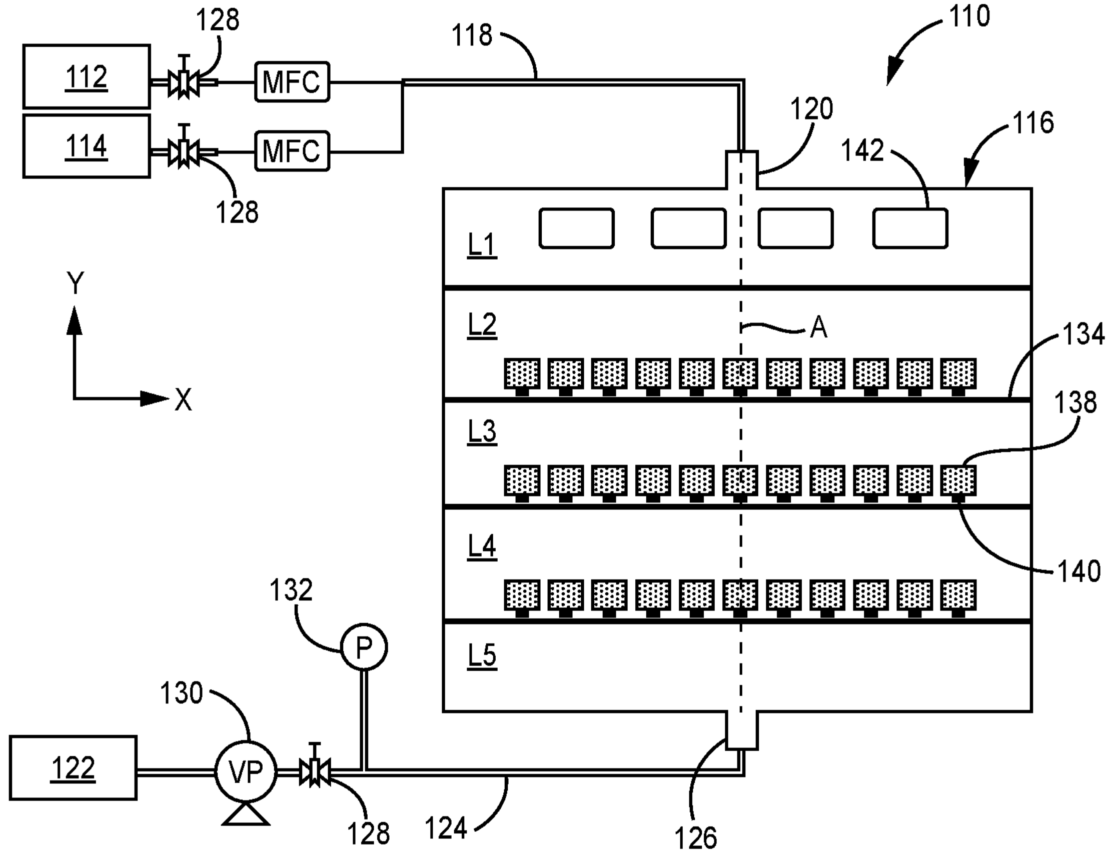
FIG. 3 is a schematic illustration of a CVI system according to a second embodiment.

FIG. 3 is a schematic illustration of alternative CVI system 110. System 110 is substantially similar to system 10 in that it includes sources 112 and 114 of reactive precursor and carrier gas, respectively, in flow communication with reactor 116, via line 118 at reactor inlet 120. Reactor 116 is in flow communication with exhaust outlet 122 via line 124 at reactor outlet 126. Longitudinal axis A of reactor 116 is disposed between inlet 120 and outlet 126. Various valves 128 can be used to control the flow from any of sources 112 and 114, and/or to exhaust outlet 122. Vacuum pump 130 can be used to change the pressure within reactor 116 by, for example, removing gases within reactor 116 to lower pressure, and pressure transducer 132 can sense vapor pressure within reactor 116. Reactor 116 also similarly includes vertically stacked perforated support plates 134 defining levels L1-L5, with preforms 138 being supported on plates 134 of levels L2-L4 (i.e., the deposition zone). Spacers 140 can be included to support preforms 138 on plates 134. Level L1 can be equivalent to the premixing/preheating zone. In an alternative embodiment, the location of inlet 120 and outlet1 26, and associate upstream/downstream components can be reversed.

Figure 4:
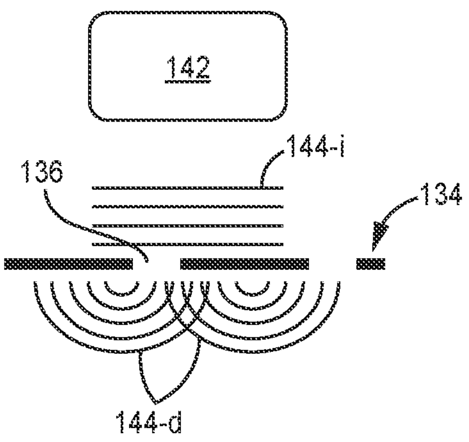
FIG. 4 is an enlarged view of a portion of a reactor of the CVI system of claim 3.

CVI system 110 differs from system 10 in positioning of acoustic wave generators 142 within reactor 116. that multiple acoustic wave generators 142 are positioned in the premixing zone (i.e., level L1) near inlet 120. Such arrangement facilitates acoustic wave diffraction through holes 136 (shown and labeled in FIG. 4) of plates 134 as acoustic waves are generated to travel generally in the y-direction. FIG. 4 is an enlarged view of one acoustic wave generator 142 and a portion of uppermost plate 134. The incident acoustic wave 144-*i* from acoustic wave generator 142 diffracts at each hole 136, and each hole acts as a localized source of the acoustic wave. diffraction waves 144-*d* can have both x and y directional components. Because there are multiple holes 136 in each plate 134, an interference pattern can form between diffraction waves 144-*d*. In this manner, the diffraction and interference of acoustic waves within reactor 116 can influence the speed, direction, and disbursement of the reactive gas flow through reactor 116, facilitating more even infiltration of preforms 138 by the reactive gas. The generation of acoustic waves within the premixing zone also helps facilitate mixing of precursor and process gas molecules.

Acoustic wave generators 142 can be operated at the same frequency or at different frequencies, generating acoustic waves having the same amplitude or different amplitudes. Phases of the acoustic waves from acoustic wave generators 142 may be shifted or synchronized. Acoustic wave generators 142 can also be operated alternatingly, for example, in a sequential pattern, at the same or different frequencies. In an alternative embodiment, a single, longer acoustic wave generator 142 can be substituted for multiple acoustic wave generators 142. Similar to CVI system 10, suitable acoustic wave frequencies can range from 1 Hz to 100 kHz, from 1 kHz to 50 kHz, or from 5 kHz to 10 kHz. In another alternative embodiment, the acoustic wave generators may be controlled by a numerical model.

Acoustic wave generators 42 and/or 142 can, in one embodiment, be manually operated in a simple "on-off" manner, with manually specified frequencies and/or amplitudes. In an alternative embodiment, acoustic wave generators 42 and/or 142 can be in communication with a local or remote controller that can control generation of acoustic waves on an as needed, or predetermined basis. More specifically, pore size of preforms 38, 138 can be monitored (e.g., by x-ray computed tomography), or estimated via numerical simulations, and acoustic wave frequencies and/or amplitudes adjusted accordingly. In some embodiments, generation of acoustic waves can be tailored to the type of preform(s) being infiltrated, with certain types and/or regions of preforms being thicker and/or less porous (e.g., filleted airfoil regions) and requiring more targeted infiltration.

Figure 5:
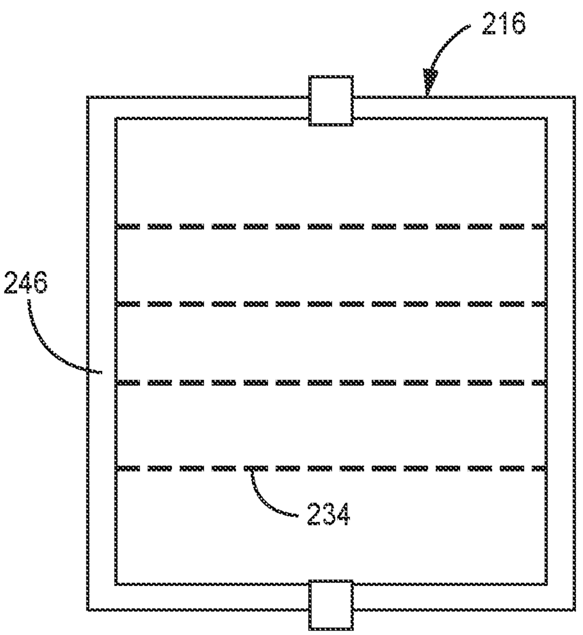
FIG. 5 is a schematic illustration of a dampened reactor for a CVI system.

FIG. 5 is a schematic illustration of dampened reactor 216, which can be used for CVI system 10 and/or 110. For simplicity, reactor 216 is shown without acoustic wave generators and preforms. Reactor 216 is substantially similar to reactors 16 and 116 having vertically stacked perforated support plates 134. Reactor 216 differs in that it is surrounded by dampening layer 246. Dampening layer can be, for example, open cell or closed cell foam, fiberglass, or vinyl, to name a few non-limiting examples. Depending on the frequencies selected for the enclosed acoustic wave generators, it can be desirable to keep the environment outside of reactor 216 free from harmful noise pollution.

The disclosed CVI systems with acoustic wave generators can be used when infiltrating preforms via CVI, to deposit interface coatings (e.g., layers of BN, SiC, Si-doped BN, etc.) and/or to form a matrix (e.g., SiC) to create a CMC part. Such CMC parts can be incorporated into aerospace, maritime, or industrial equipment, to name a few, non-limiting examples. In an alternative embodiment, acoustic wave generators 42, 142 can be position outside of and proximate reactor 16, 116. In another alternative embodiment, other gas-phase reactors and/or systems can be modified with acoustic wave generators to manipulate gas flow to facilitate more even deposition in processes such as chemical vapor deposition (CVD), atomic layer deposition (ALD), and physical vapor deposition (PVD).

DISCUSSION OF POSSIBLE EMBODIMENTS

The following are non-exclusive descriptions of possible embodiments of the present invention.

A chemical vapor infiltration (CVI) system comprises a reactor with an inlet for receiving a flow of reactive gas and an outlet for exhausting the flow of reactive gas, and plurality of acoustic wave generators disposed to generate acoustic waves within the reactor.

The system of the preceding paragraph can optionally include, additionally and/or alternatively, any one or more of the following features, configurations and/or additional components:

The above system can further include a plurality of perforated plates stacked vertically between the inlet and the outlet and defining a plurality of levels therebetween.

Any of the above systems can further include a premixing zone between the inlet and an uppermost perforated plate of the plurality of perforated plates.

In any of the above systems, at least a subset of the plurality of acoustic wave generators can be positioned in the premixing zone.

In any of the above systems, each of the plurality of acoustic wave generators can be positioned in the premixing zone, and each of the plurality of acoustic wave generators can be oriented such that generated acoustic waves travel toward the outlet.

In any of the above systems, the subset of the plurality of acoustic wave generators positioned within the premixing zone can include a first pair of oppositely disposed acoustic wave generators.

Any of the above systems can further include a second pair of oppositely disposed acoustic wave generators positioned between the uppermost perforated plate and a penultimate perforated plate.

In any of the above systems, each acoustic wave generator of the first pair can be oriented such that generated acoustic waves travel toward the other acoustic wave generator of the first pair.

Any of the above systems can further include a fibrous preform supported by one perforated plate of the plurality of perforated plates.

Any of the above systems can further include an acoustic dampening layer disposed around an exterior of the reactor.

Any of the above systems can further include a precursor source and a process gas source.

Any of the above systems can further include a first fluid line placing the inlet of the reactor in flow communication with the precursor source and the process gas source, and a second fluid line placing the outlet of the reactor in flow communication with an exhaust outlet.

Any of the above systems can further include a vacuum pump and a pressure transducer downstream of the outlet of the reactor.

A method of performing CVI comprises placing a fibrous preform within a reactor, flowing a reactive gas through an inlet of the reactor, and generating acoustic waves at a first frequency within the reactor.

The method of the preceding paragraph can optionally include, additionally and/or alternatively, any one or more of the following features, configurations and/or additional components:

In the above method, the acoustic waves can be generated orthogonal to a longitudinal axis of the reactor by at least a first pair of oppositely disposed acoustic wave generators.

In any of the above methods, the acoustic waves can be generated parallel to a longitudinal axis of the reactor by a plurality of acoustic wave generators positioned near the inlet.

In any of the above methods, a plurality of diffraction waves can be generated by a perforated plate within the reactor.

In any of the above methods, the first frequency can range from 1 Hz to 100 kHz.

In any of the above methods, the first frequency can range from 1 kHz to 50 kHz.

Any of the above methods can further include generating acoustic waves at a second frequency within the reactor, the second frequency being different from the first frequency.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A chemical vapor infiltration (CVI) system comprising:

a reactor comprising:

an inlet for receiving a flow of reactive gas;

an outlet for exhausting the flow of reactive gas; and an acoustic dampening layer disposed around an exterior of the reactor; and a plurality of acoustic wave generators disposed to generate acoustic waves within the reactor.

2. The system of claim 1 and further comprising:

a plurality of perforated plates stacked vertically between the inlet and the outlet and defining a plurality of levels therebetween.

3. The system of claim 2 and further comprising:

a premixing zone between the inlet and an uppermost perforated plate of the plurality of perforated plates.

4. The system of claim 3, wherein at least a subset of the plurality of acoustic wave generators are positioned in the premixing zone.

5. The system of claim 3, wherein each of the plurality of acoustic wave generators are positioned in the premixing zone, and wherein each of the plurality of acoustic wave generators are oriented such that generated acoustic waves travel toward the outlet.

6. The system of claim 4, wherein the subset of the plurality of acoustic wave generators positioned within the premixing zone comprises a first pair of oppositely disposed acoustic wave generators.

7. The system of claim 6 and further comprising:

a second pair of oppositely disposed acoustic wave generators positioned between the uppermost perforated plate and a penultimate perforated plate.

8. The system of claim 6, wherein each acoustic wave generator of the first pair is oriented such that generated acoustic waves travel toward the other acoustic wave generator of the first pair.

9. The system of claim 2 and further comprising:

a fibrous preform supported by one perforated plate of the plurality of perforated plates.

10. The system of claim 1 and further comprising:

a precursor source; and a process gas source.

11. The system of claim 10 and further comprising:

a first fluid line placing the inlet of the reactor in flow communication with the precursor source and the process gas source; and a second fluid line placing the outlet of the reactor in flow communication with an exhaust outlet.

12. The system of claim 10 and further comprising:

a vacuum pump and a pressure transducer downstream of the outlet of the reactor.

13. A method of performing CVI, the method comprising:

placing a fibrous preform within a reactor, the reactor comprising:

an inlet for receiving a flow of reactive gas;

an outlet for exhausting the flow of reactive gas; and an acoustic dampening layer disposed around an exterior of the reactor;

flowing the reactive gas through the inlet of the reactor; and generating acoustic waves at a first frequency within the reactor.

14. The method of claim 13, wherein the acoustic waves are generated orthogonal to a longitudinal axis of the reactor by at least a first pair of oppositely disposed acoustic wave generators.

15. The method of claim 13, wherein the acoustic waves are generated parallel to a longitudinal axis of the reactor by a plurality of acoustic wave generators positioned near the inlet.

16. The method of claim 15, wherein a plurality of diffraction waves are generated by a perforated plate within the reactor.

17. The method of claim 13, wherein the first frequency ranges from 1 Hz to 100 kHz.

18. The method of claim 17, wherein the first frequency ranges from 1 kHz to 50 kHz.

19. The method of claim 13 and further comprising:

generating acoustic waves at a second frequency within the reactor, the second frequency being different from the first frequency.

* * * * *